(12) United States Patent
Kaito

(10) Patent No.: US 6,740,368 B2
(45) Date of Patent: May 25, 2004

(54) BEAM SHAPED FILM PATTERN FORMATION METHOD

(75) Inventor: Takashi Kaito, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 44 days.

(21) Appl. No.: 10/001,333

(22) Filed: Oct. 26, 2001

(65) Prior Publication Data

US 2002/0127352 A1 Sep. 12, 2002

(30) Foreign Application Priority Data

Oct. 31, 2000 (JP) .................................... 2000-333368

(51) Int. Cl.[7] .............................................. C23C 16/04
(52) U.S. Cl. ...................... 427/586; 427/595; 427/140; 427/142; 427/256; 427/258; 427/261
(58) Field of Search ................................ 427/526, 586, 427/595, 140, 142, 256, 258, 261

(56) References Cited

FOREIGN PATENT DOCUMENTS

| JP | 07037887 A | * | 2/1995 | ....... H01L/21/3205 |
| JP | 07117849 A | * | 5/1995 | ........... B60L/13/04 |

OTHER PUBLICATIONS

Matsui et al., J. Vac. Sci. Technol. B 18(6), Nov./Dec. 2000, pp. 3181–3184.*

* cited by examiner

Primary Examiner—Timothy Meeks
(74) Attorney, Agent, or Firm—Adams & Wilks

(57) ABSTRACT

When forming a beam shaped body by deposition using a focused ion beam device on the end of a sample, the present invention adopts a beam shaped film pattern formation method for irradiating the focused ion beam to a narrow strip shaped region from an open end of the sample to an outer space, and depositing a beam shaped film on the narrow strip shaped region, and sequentially shifting the irradiation region in a tip end direction to cause formation of a beam shaped body by growth of thin deposition layers, and causing formation of a deposition film of desired thickness on the thin deposition layers on the beam shaped body.

11 Claims, 5 Drawing Sheets

BEAM SHAPED FILM PATTERN FORMATION METHOD

BACKGROUND OF THE INVENTION

The present invention relates to a mask used to allow formation of a desired pattern as a projection on a semiconductor wafer or the like, and particularly to a method for correcting white defects in a stencil mask of an electron beam system.

Silicon stencil white defect correction (repair processing for missing locations) has been performed in the related art with deposition of carbon or the like using a focused ion beam device, namely by injecting an aromatic gas such as phenanthrene from a gas gun onto a defective region, and at the same time irradiating an ion beam to the defective region, and performing carbon deposition to bury the defects. FIG. 5 shows a design pattern opening 3 formed in a thin film 2 with a stencil for electron beam processing, and has a basic structure of lattice shaped struts 4 forming a lining so as to impart mechanical strength to a stencil, being a thin film. However, as shown in FIG. 3, in the event that repair processing is carried out as processing to construct a bridge across a groove shaped opening 31, the related art method, as shown by the chain line in the center of the drawing, is implemented by making all defective regions spanning the two sides of the opening ion beam irradiation regions SE, and subjecting these regions to deposition, and so initially, in order to avoid a foundation for attaching carbon at the groove section, a deposition layer is not formed. Carbon attachment commences from an end section, attachment gradually advances on a carbon deposition layer where there is attachment, and the deposition layer is grown overlapping advancement in the thickness direction and the central direction. This aspect is shown in FIGS. 4A–4B. FIG. 4B is a view looking from above, and a deposition layer D is formed as a bridge across the groove opening 31, but in the side cross sectional view of FIG. 4A, the shape of the deposition layer D appears as a plurality of chronologically deposited layers. The lower layer D1 in the drawing is an initial processing layer, and the upper layers are deposited as processing time elapses, in the order (D2>D3>D4>D5>D6). At a point in time where the central sections join, the deposition layer D is formed thin at the central portion, and thick at the two end section. As is clear from this, there is a problem with the bridge film pattern formation method of the related art in that if thickness at the central section is to be guaranteed, the thickness at both end sections must be even thicker. In semiconductor lithography using photo etching, there is a light wavelength limit, and with the latest semiconductor processes capable of achieving ultra-high density, projection electron beam lithography is suitable. In the case of this projection electron beam lithography, it is necessary to obtain a scattering power of electrons by a silicon thin film, being a stencil, in a fixed range. Also, if the bridge becomes long, it is extremely difficult with deposition of the related art, and even if it is possible to form a bridge, at the point in time when the central sections join, the thickness at the two end sections is extremely large, and because of the difference in thickness, transmission and diffusion of electrons becomes non-uniform, and this is not suitable for a stencil.

The purpose of the present invention is to provide a correction method, in correction of white defects of a silicon stencil by deposition using a focused ion beam, where there is no difference in thickness between a deposition layer formed in defect end sections and a deposition layer formed at tip sections, realizing correction of defects where sections randomly become insufficiently thick, and to provide a correction method capable of forming a long bridge.

SUMMARY OF THE INVENTION

When forming a beam shaped body by deposition using a focused ion beam device on the end of a sample, the present invention adopts a beam shaped film pattern formation method for subjecting an irradiation region of an ion beam to deposition narrowly limited to a strip shape from ends of the sample, and sequentially shifting the irradiation region in a tip end direction to cause formation of a beam shaped body by growth of thin deposition layers, and causing formation of a deposition film of desired thickness on the thin deposition layers on the beam shaped body.

DETAILED DESCRIPTION OF THE INVENTION

Figure 2A:
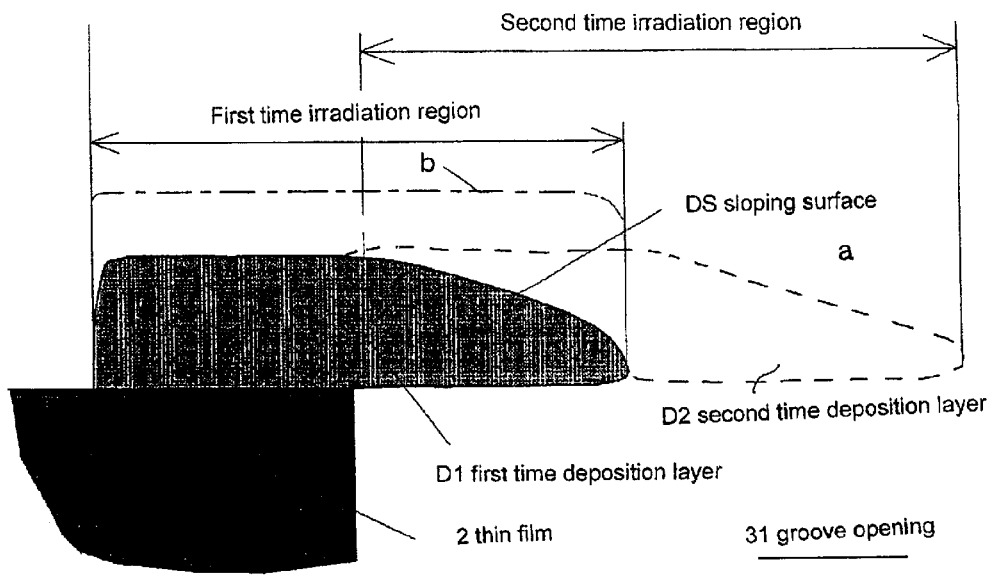
FIGS. 2A–2C schematically shows steps for causing growth of a deposition layer in a strip shape according to the invention, with FIG. 2A describing the principles of deposition layer growth in the present invention, FIG. 2B describing growth of a cantilever beam shaped body, and FIG. 2C describing growth of a stepped shape deposition layer.
Figure 2B:
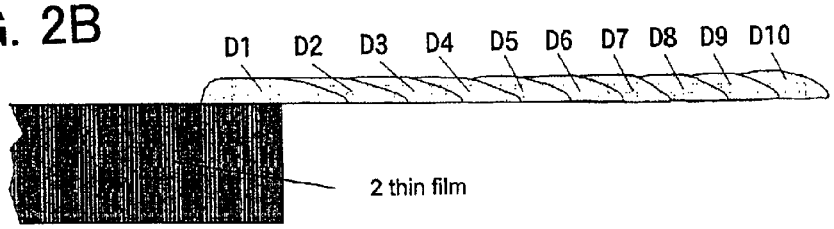
Figure 2C:
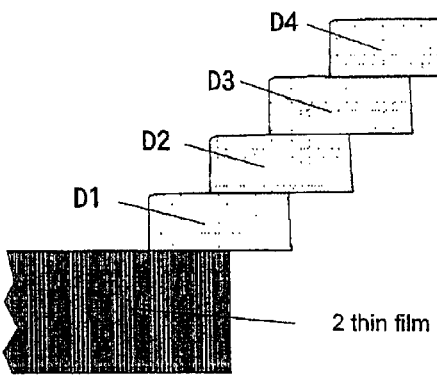
Figure 3:
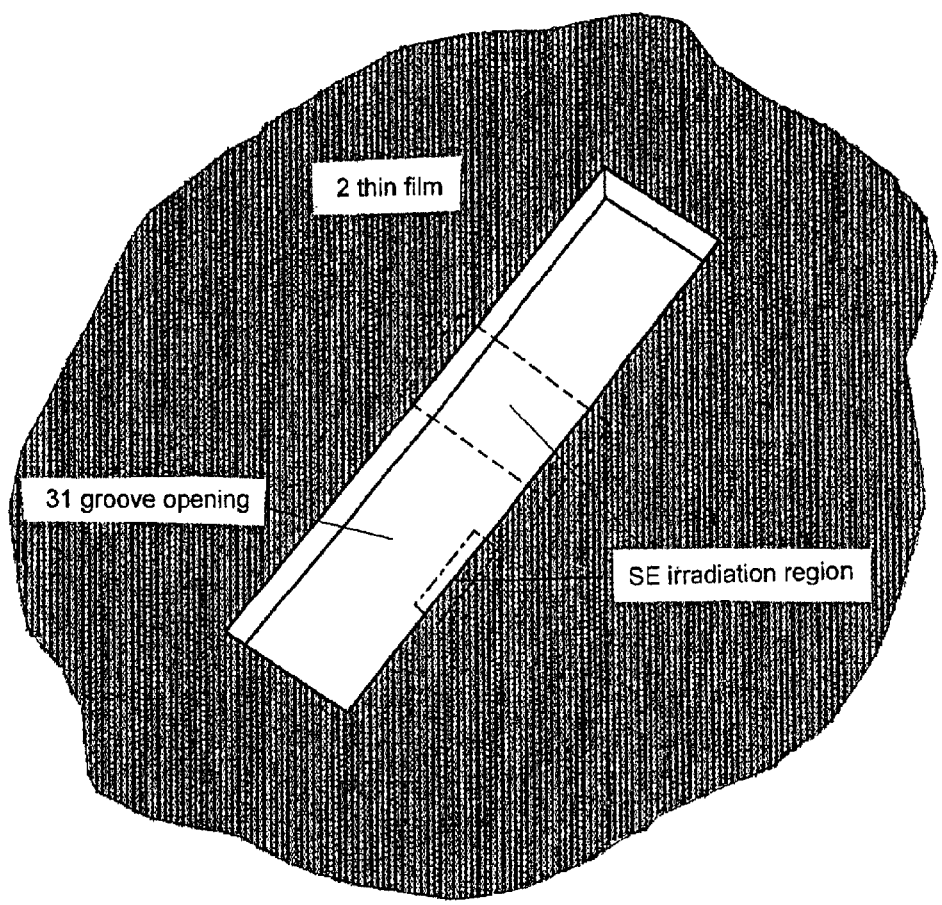
FIG. 3 is a drawing showing electron beam irradiation areas when forming a bridge pattern in an opening of a stencil mask formed as a thin film.

The present invention has been conceived in consideration of the fact that with a deposition method of the related art, initially, a deposition layer is not formed, as there is no foundation for attaching carbon, carbon attachment commences from end sections, attachments gradually advance on the deposition layer of attached carbon, the deposition layer overlaps advancement in the thickness direction and the central direction and grows, and with the bridge film pattern formation method of the present invention, initial processing for a central region of the opening that is useless is not carried out, and processing is performed with an irradiation region limited to close to open ends shown by the chain line in FIG. 3. Then, deposition is performed in a strip shaped irradiation region, and while moving the irradiation region gradually to the center of the opening the deposition layer is caused to grow gradually in the central direction. At this time, a significant technique is to shift to the next irradiation region in time with formation of a sloping surface DS on a tip side of the deposition layer, as shown in FIG. 2A. Formation of the sloping surface DS is performed by sequentially advancing attachment from the ends, because at the time of initial irradiation there is no attachment foundation at the tip side of the irradiation region. However, if a temporary foundation is possible, it becomes possible to form a deposition layer on this foundation, and if the time of irradiation to the same region is made longer, the deposition layer does not simply become thicker, as shown by the chain line b in FIG. 2A, but the sloping surface DS disappears and becomes instead a flat deposition surface. In that way, an edge of the deposition layer on a growth tip side rises up, and if the irradiation region is subsequently shifted and a deposition layer formed the next slit deposition layer grows as a step shape upwards and in the tip direction, as shown in FIG. 2C, which is an undesired formation. With the present invention, when the tip side of the deposition layer is being formed like a ledge, the irradiation region is shifted to the tip side so as to overlap the sloping surface DS section, and deposition is performed again. The deposition layer the second time is also formed having a sloping surface DS, as shown by the dotted line a in FIG. 2A. At the point in time when this state is reached, the irradiation region is again shifted to the tip side, and a sequential deposition layer is grown on the tip side Film formation using this method does not produce a stepped shape for the deposition layer of each strip, as shown in FIG. 2B, and it is possible to form a fixed length cantilever beam shaped body having the position of a lower surface. It is also possible to grow directly alongside with a thin film thickness of ten times or more, and it has been conformed that this thickness can be formed uniform and flat.

Embodiment 1

Figure 1A:
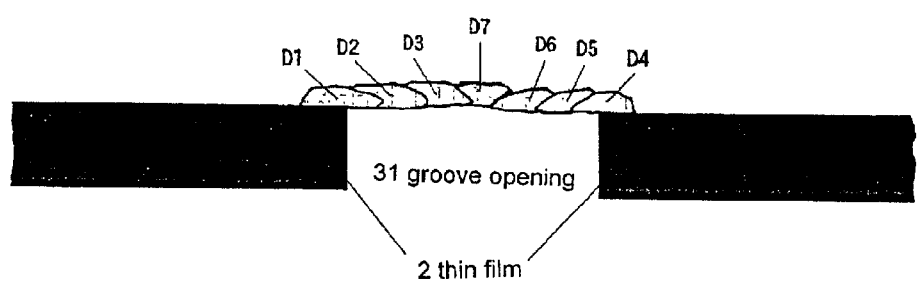
FIGS. 1A and 1B are side elevations showing an embodiment of bridge film pattern formation according to the present invention, with FIG. 1A showing a state where a deposition layer is formed in a strip shape, and FIG. 1B showing a state where a layer of desired thickness is formed on the strip-shaped layer.
Figure 1B:
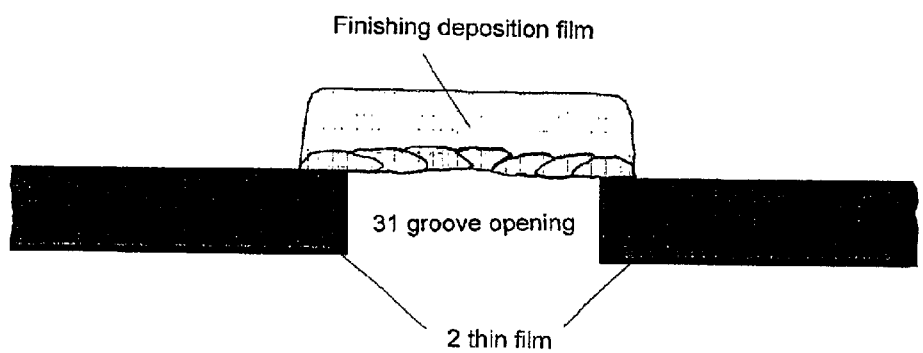
Figure 4A:
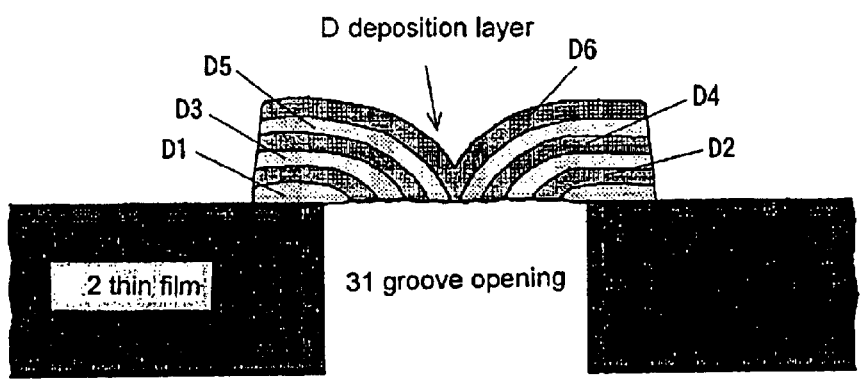
FIGS. 4A–4B shows bridge pattern formation states of the related art, with FIG. 4A being a side elevation, and FIG. 4B being a plan view.
Figure 4B:
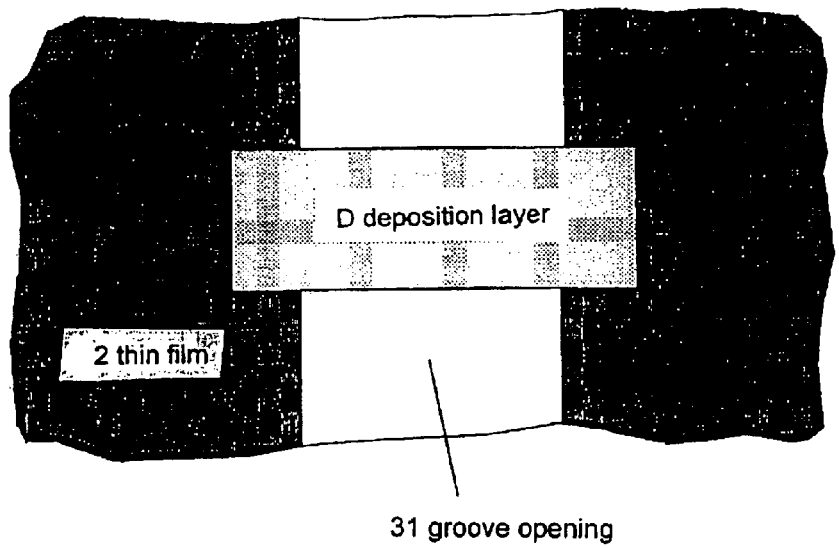
Figure 5:
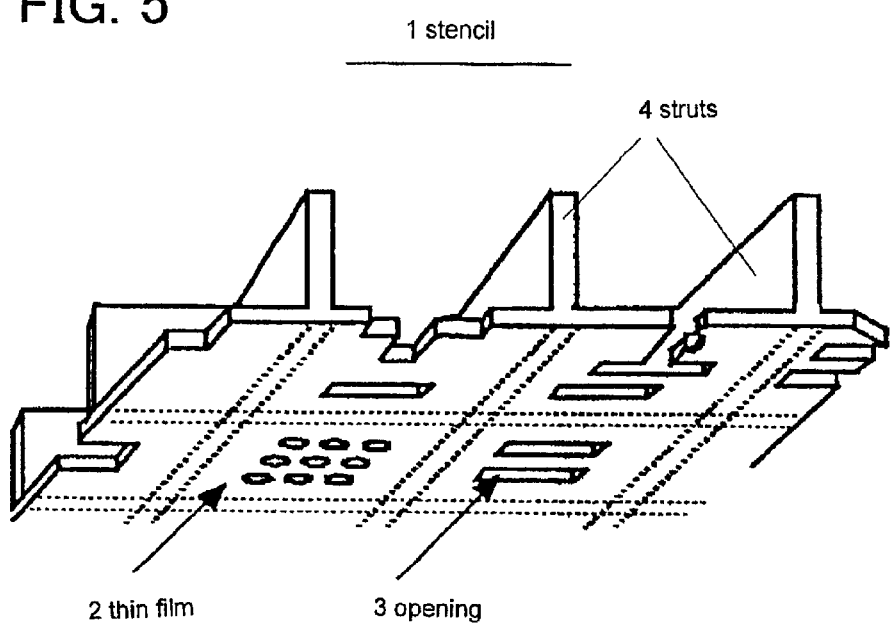
FIG. 5 is a perspective view of a stencil mask adopting the present invention.

An embodiment of the present invention will now be described with reference to FIGS. 1A and 1B. An example will be given of a groove-like opening 31 in a silicon thin film 2 of a stencil mask for electron beam processing, as shown in FIG. 3, and processing to form a bridge film the same as the irradiation area of the related art shown by a dotted line in the drawing. The irradiation region of the focused ion beam is limited to a narrow strip shaped region at an opening as shown by the chain line in FIG. 3, and phenanthrene gas from a gas gun is sprayed against the edge of this region to scan a beam multiple times. In doing this, the deposition film shown by D1 in FIG. 1A is formed first. Continuing on, the irradiation region of the focused ion beam overlaps the sloping surface DS of the deposition layer D1 and is shifted to the center. At this time, the deposition layer D2 is formed extending laterally outward from the end of the opening to the center side of the deposition layer D1. Similarly, the deposition layer D3 is sequentially grown to the center side, and advances to close to the center portion. Continuing on again, the region is also narrowly limited strip shape from the opposite side of the opening, and phenanthrene gas from a gas gun is sprayed against the edge of this region and a beam scanned multiple times. Then the deposition layer D4 is formed, and then the deposition layers D5 and D6 are formed in that order. In doing this, at the center of the opening 31 end sections of the deposition layers D3 and D6 become confronting shapes inside the span of the strip of the irradiation region, an irradiation region spanning the two ends is set and the deposition layer D7 is formed to bridge across. This state is the state shown in FIG. 1A. As will be understood from this drawing, the bridge film thus formed has a thin uniform thickness with no supporting structure thereunder beyond the ends of the opening, which means that deposition is carried out again to obtain a desired thickness according to necessity. In that case, the irradiation region of the focused ion beam is set so as to reach the bridge body, and a finishing deposition layer as shown in the side elevation of FIG. 1B or the plan view of FIG. 4B is formed. At the point in time where the desired thickness is attained, processing is terminated.

The present invention is a method for forming a bridge film by deposition using a focused ion beam device in a groove of a sample, and adopts a bridge film pattern formation method where an irradiation region is limited to a narrow strip shape form both ends of the groove, deposition is carried out, and the irradiation region is sequentially shifted in a central direction to cause a thin deposition layer to extend, and the deposition layer is joined at a central section from both ends, and so it is possible to form a bridge pattern in a wide opening. Also, since it is possible to cause growth in a lateral direction as a thin deposition layer, a bridge can be formed having a uniform thickness at end sections and in the center. Accordingly, when this method is adopted for white defect repair such as for stencil masks of a electron beam stepper, high precision can be obtained and it is possible to make a high quality mask.

In the bridge film formation method, by making the timing at which the irradiation region is shifted to the center in time with formation of a sloping surface on a central side of the deposition film, it is possible to make growth of the deposition layer towards the center side longer than the thin thickness. Also, by widening the irradiation region on the thin deposition layer joined at the central portion and performing deposition, a deposition layer having a desired thickness can be easily formed.

What is claimed is:

1. A method of depositing a thin film extending laterally outward from an edge of a sample comprising the steps of:
   irradiating a focused ion beam onto a sample proximate the edge thereof while injecting a film-forming gas to deposit a thin film on a narrow region at the edge of the sample; and
   sequentially shifting the focused ion beam in a direction extending outward from the edge of the sample to cause the thin film to grow laterally outward from the edge of the sample, a timing of the shifting of the focused ion beam being coincident with formation of a sloped surface on a side of the deposited film.

2. A method of depositing a thin film according to claim 1; further comprising the step of depositing another film on the thin film to achieve a desired thickness.

3. A method of depositing a thin film according to claim 1; wherein the edge of the sample is an edge of an opening formed in the sample, and the thin film is deposited to extend over the opening.

4. A method of depositing a thin film according to claim 3; wherein the thin film is a bridge film having no supporting structure thereunder beyond the edge of the opening.

5. A method of depositing a thin film according to claim 1; wherein the thin film has no supporting structure thereunder beyond the edge of the sample.

6. A method of depositing a thin film according to claim 1; wherein the thin film has a relatively flat upper surface.

7. A method of forming a bridge film extending across opposite ends of an opening in a sample, comprising the steps of:
   irradiating a focused ion beam onto opposite ends of an opening in a sample while injecting a film-forming gas to deposit thin films on a narrow regions at the opposite ends of the opening; and
   sequentially shifting the focused ion beam toward a center of the opening to cause the respective thin films to grow in a direction extending from the opposite ends of the opening toward the center of the opening, a timing of the shifting of the focused ion beam being coincident with formation of a sloped surface on a side of the deposited thin films.

8. A method of forming a bridge film according to claim 7; further comprising the step of joining the deposited thin films at a central section of the opening.

9. A method of forming a bridge film according to claim 7; further comprising the step of depositing another film over the bridge film to achieve a desired thickness.

10. A method of forming a bridge film according to claim 7; wherein the bridge film has no supporting structure thereunder between the opposite ends of the opening.

11. A method of forming a bridge film according to claim 7; wherein the bridge film has a relatively flat upper surface.

* * * * *